(12) United States Patent
Sakaguchi et al.

(10) Patent No.: US 10,717,896 B2
(45) Date of Patent: Jul. 21, 2020

(54) CURABLE HEAT RADIATION COMPOSITION

(71) Applicant: SHOWA DENKO K.K., Minato-ku, Tokyo (JP)

(72) Inventors: Yoichiro Sakaguchi, Tokyo (JP); Kentarou Takahashi, Tokyo (JP); Keisuke Mameda, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 359 days.

(21) Appl. No.: 15/627,532

(22) Filed: Jun. 20, 2017

(65) Prior Publication Data
US 2017/0283645 A1    Oct. 5, 2017

Related U.S. Application Data

(62) Division of application No. 14/387,407, filed as application No. PCT/JP2013/054334 on Feb. 21, 2013, now abandoned.

(30) Foreign Application Priority Data

Mar. 30, 2012   (JP) ................................ 2012-079351
May 18, 2012    (JP) ................................ 2012-114763

(51) Int. Cl.
*C08K 3/38* (2006.01)
*C09D 163/00* (2006.01)
(Continued)

(52) U.S. Cl.
CPC .............. *C09D 163/00* (2013.01); *C08K 3/22* (2013.01); *C08K 3/28* (2013.01); *C08K 3/38* (2013.01);
(Continued)

(58) Field of Classification Search
CPC .. C09D 163/00; C09D 133/00; C09D 133/14; C09J 5/06; H05K 7/20481;
(Continued)

(56) References Cited

U.S. PATENT DOCUMENTS 6,114,429 A  * 9/2000  Yamada ................. C08L 83/04
                                                    252/512
6,831,031 B2  12/2004  Ishihara
(Continued)

FOREIGN PATENT DOCUMENTS

CN      101161721 A    4/2008
JP      2003-60134 A   2/2003
(Continued)

OTHER PUBLICATIONS

International Preliminary Report on Patentability dated Oct. 1, 2014 in PCT/JP2013/054334, 8 pages.
(Continued)

*Primary Examiner* — Jeffrey M Wollschlager
*Assistant Examiner* — Armand Melendez
(74) *Attorney, Agent, or Firm* — Sughrue Mion, PLLC

(57) ABSTRACT

The present invention relates to a curable heat radiation composition which includes two types of fillers with different compressive breaking strengths (except when the two types of fillers are the same substance) and a thermosetting resin, the compressive breaking strength ratio of the two types of fillers [compressive breaking strength of a filler (A) with a higher compressive breaking strength/compressive breaking strength of a filler (B) with a lower compressive breaking strength] being 5 to 1,500, the compressive breaking strength of the filler (A) being 100 to 1,500 MPa, and the compressive breaking strength of the filler (B) being 1.0 to 20 MPa, an adhesive sheet using the composition and a method for producing the same. An aluminum nitride is
(Continued)

preferable as the filler (A) and hexagonal boron nitride agglomerated particles are preferable as the filler (B).

14 Claims, 2 Drawing Sheets

(51) Int. Cl.
| H01L 23/373 | (2006.01) |
| H01L 23/495 | (2006.01) |
| C08K 3/22 | (2006.01) |
| H05K 7/20 | (2006.01) |
| H01L 23/36 | (2006.01) |
| H01L 23/433 | (2006.01) |
| H01L 23/24 | (2006.01) |
| H01L 23/29 | (2006.01) |
| C08K 3/28 | (2006.01) |
| C09D 133/14 | (2006.01) |
| C09J 5/06 | (2006.01) |
| C08K 3/40 | (2006.01) |
| C09D 133/00 | (2006.01) |
| H01L 23/31 | (2006.01) |
| H01L 23/00 | (2006.01) |

(52) U.S. Cl.
CPC .............. *C08K 3/40* (2013.01); *C09D 133/00* (2013.01); *C09D 133/14* (2013.01); *C09J 5/06* (2013.01); *H01L 23/24* (2013.01); *H01L 23/295* (2013.01); *H01L 23/36* (2013.01); *H01L 23/3737* (2013.01); *H01L 23/4334* (2013.01); *H01L 23/49551* (2013.01); *H01L 23/49575* (2013.01); *H05K 7/20481* (2013.01); C08K 2003/2227 (2013.01); C08K 2003/2241 (2013.01); C08K 2003/282 (2013.01); C08K 2003/385 (2013.01); H01L 23/3107 (2013.01); H01L 24/29 (2013.01); H01L 24/32 (2013.01); H01L 24/33 (2013.01); H01L 24/48 (2013.01); H01L 24/73 (2013.01); H01L 2224/291 (2013.01); H01L 2224/32245 (2013.01); H01L 2224/33181 (2013.01); H01L 2224/451 (2013.01); H01L 2224/48091 (2013.01); H01L 2224/48096 (2013.01); H01L 2224/48106 (2013.01); H01L 2224/48137 (2013.01); H01L 2224/48247 (2013.01); H01L 2224/73215 (2013.01); H01L 2224/73265 (2013.01); H01L 2924/00014 (2013.01); H01L 2924/07802 (2013.01); H01L 2924/12042 (2013.01); H01L 2924/181 (2013.01); H01L 2924/19107 (2013.01); Y10T 156/10 (2015.01); Y10T 428/2848 (2015.01); Y10T 428/31511 (2015.04)

(58) Field of Classification Search
CPC . H01L 2224/48106; H01L 2224/48096; H01L 2924/181; H01L 2924/12042; H01L 2924/00014; H01L 2224/451; H01L 2924/07802; H01L 2224/73215; H01L 2224/33181; H01L 2224/291; H01L 24/73; H01L 24/48; H01L 24/33; H01L 24/32; H01L 24/29; H01L 23/3107; H01L 2924/19107; H01L 2224/73265; H01L 2224/48247; H01L 2224/48137; H01L 2224/48091; H01L 2224/32245; H01L 23/295; H01L 23/49575; H01L 23/49551; H01L 23/4334; H01L 23/3737; H01L 23/36; H01L 23/24; C08K 2003/2241; C08K 2003/2227; C08K 2003/385; C08K 2003/282; C08K 3/40; C08K 3/22; C08K 3/38; C08K 3/28; Y10T 156/10; Y10T 428/2848; Y10T 428/31511

See application file for complete search history.

(56) References Cited

U.S. PATENT DOCUMENTS

| 6,887,811 B2 | 5/2005 | Kanbara et al. |
| 2002/0006373 A1* | 1/2002 | Clere .................. C01B 21/0648 423/290 |
| 2003/0207980 A1 | 11/2003 | Onishi et al. |
| 2010/0226095 A1 | 9/2010 | Mimura et al. |
| 2013/0012621 A1 | 1/2013 | Yamamoto et al. |

FOREIGN PATENT DOCUMENTS

| JP | 2005-82758 A | 3/2005 |
| JP | 2009-24126 A | 2/2009 |
| JP | 2009269337 A | 11/2009 |
| JP | 2011-6586 A | 1/2011 |
| JP | 2011-144234 A | 7/2011 |
| KR | 1020070078792 A | 8/2007 |
| WO | 2011/104996 A1 | 9/2011 |

OTHER PUBLICATIONS

International Search Report of PCT/JP2013/054334, dated Apr. 23, 2013. [PCT/ISA/210].

Hiromi, Ito et al., "Thermally Conductive Resin Composition, Thermally Conductive Resin Sheet and Power Module", English translation of JP 2009-227947A, published on Oct. 8, 2009, 38 pages.

Yamagata, Toshitaka et al., "Thermally Conductive Resin Composition", machine translation of JP 2011-144234A, Jul. 28, 2011, 31 pages.

Takigawa, Hideki et al., "Thermosetting resin composition, thermal conductive resin sheet, manufacturing method thereof and power module", Machine translation of JP 2011-006586A, published Jan. 13, 2011, 20 pages.

Ito, Hiromi et al., "Thermal conductive resin composition, thermal conductive resin, and power module", machine translation of JP 2009-227947A, published on Oct. 8, 2009, 18 pages.

Toshiyoshi, Yamagata et al., "Heat-conductive resin composition", English translation of JP 2011-144423A, published on Jul. 28, 2011, 31 pages.

Hirano, Keisuke et al., "Polymer composition, thermally conductive sheet, highly thermally conductive adhesive sheet with metal foil, highly conductive adhesive sheet with metal plate, metal based circuit board and power module", machine translation of JP2009-024126A, published Feb. 5, 2009, 18 pages.

* cited by examiner

[FIG. 1]
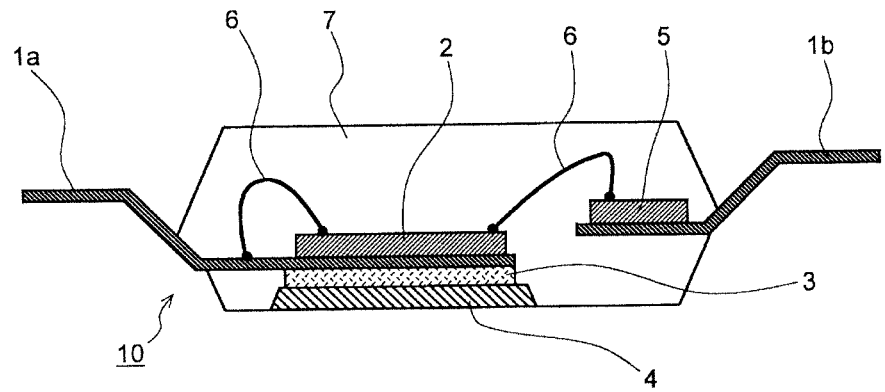
[FIG. 2]
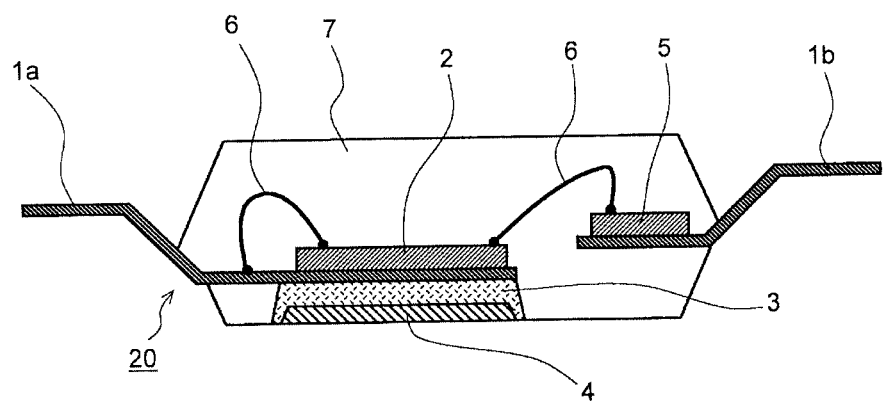
[FIG. 3]
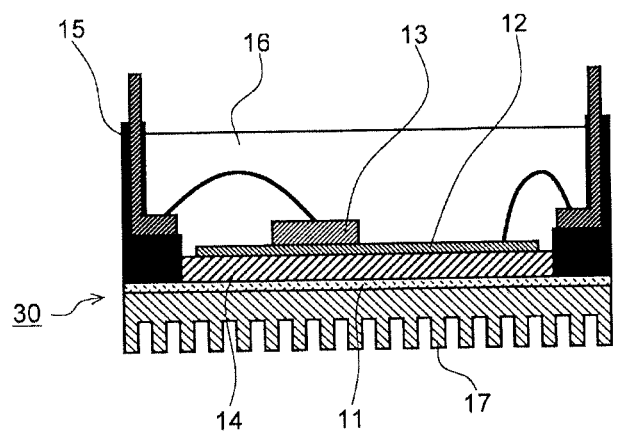

[FIG. 4]
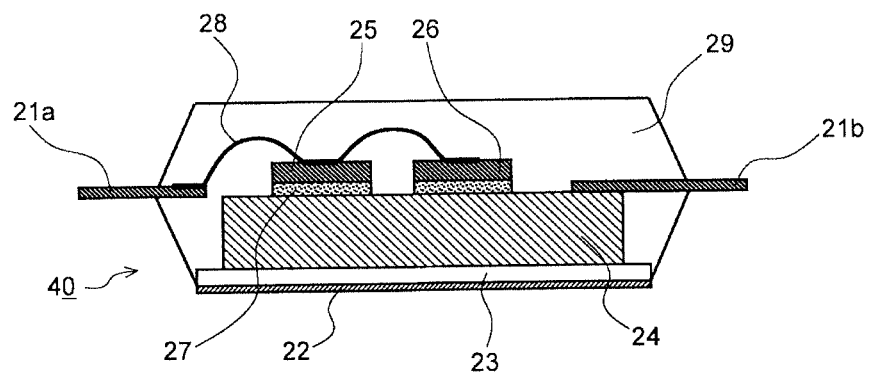
[FIG. 5]
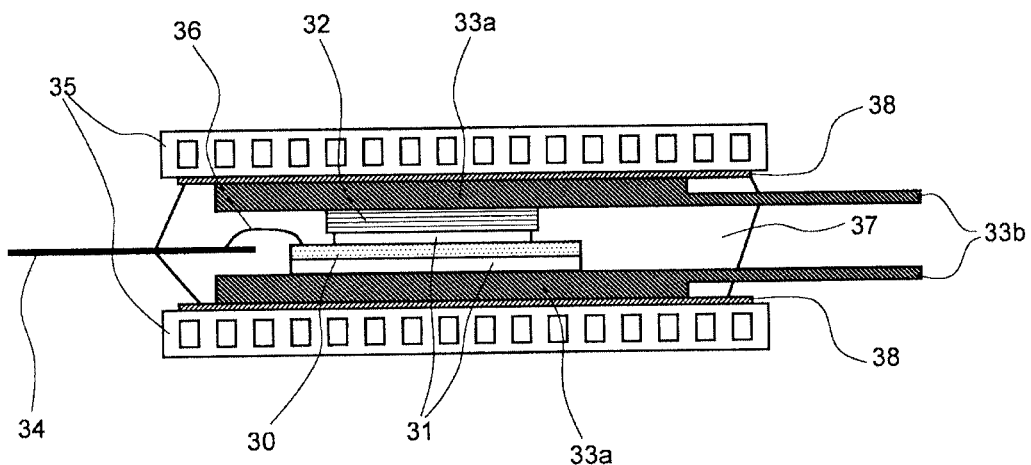

CURABLE HEAT RADIATION COMPOSITION

CROSS REFERENCE TO RELATED APPLICATIONS

This application is a divisional of application Ser. No. 14/387,407 filed Sep. 23, 2014, which is a National Stage of International Application No. PCT/JP2013/054334 filed Feb. 21, 2013 (claiming priority based on Japanese Patent Application Nos. 2012-079351, filed Mar. 30, 2012, and 2012-114763, filed May 18, 2012), the contents of which are incorporated herein by reference in their entirety.

TECHNICAL FIELD

The present invention relates to a curable heat radiation composition excellent in heat radiation property in its thickness direction to be used for transferring heat from a heat-generating member such as an electronic or electrical component to a heat-radiating member, an adhesive sheet using the composition, and a heat radiation cured product obtained by curing the composition.

BACKGROUND ART

In recent years, in association with a reduction in size of an electrical or electronic component and an increase in power thereof, it has become a problem how heat generated from the electronic component or the like is radiated in a narrow space. An insulating adhesive or sheet that conducts heat from a portion of the electronic component from which the heat is to be generated to a heat-radiating member has been used as one means for the radiation. A composition obtained by filling a thermosetting resin with an inorganic high heat-radiating filler has been used in such adhesive or sheet. However, the quantity of heat generated from electronic equipment or an electronic component tends to increase, and hence an additional improvement in heat conductivity of the adhesive or sheet to be used for such equipment or component has been required. To this end, the resin needs to be filled with a higher concentration of the inorganic high heat-radiating filler. When the composition is used as the insulating adhesive or sheet, its heat conductivity in its thickness direction needs to be increased. Spherical alumina (having a heat conductivity of 36 W/m·K) or crystalline silica (12 W/m·K) is available as a filler suitable for the need. However, an improvement in heat radiation property achieved with the heat conductivity of such filler is limited. In view of the foregoing, in recent years, an agglomerated particle of hexagonal boron nitride (hereinafter sometimes abbreviated as "hBN") has been attracting attention as a filler that improves heat radiation property in a thickness direction. The crystal structure of each of primary particles of hBN is a graphite-like hexagonal network layer structure. In addition, the particle has a scaly shape and has the following characteristic. The heat conductivity of the scaly-shaped particle in its surface direction is about 20 times (60 to 80 W/m·K) as large as its heat conductivity in its thickness direction, in other words, the heat conductivities are anisotropic. The hBN agglomerated particle is obtained by the agglomeration of the primary particles and has a characteristic in that its heat conductivities are isotropic, and hence the heat radiation property of a molded body containing the particle in its thickness direction can be significantly improved.

As related art documents disclosing heat radiation compositions using hBN agglomerated particles, there are known JP 2003-60134 A (U.S. Pat. No. 6,831,031) (Patent Document 1), JP 2009-24126 A (Patent Document 2), and JP 2011-6586 A (Patent Document 3).

In Patent Document 1, an hBN primary particle and the hBN agglomerated particle have been used in combination, but a heat conductivity in a thickness direction of only up to 3.8 W/m·K has been obtained.

In addition, Patent Document 2 makes a proposal to the effect that when an hBN agglomerated particle having a hardness based on a constant nanoindentation method of 500 MPa or more is used, the hBN agglomerated particle does not break at the time of molding. However, a heat conductivity in a thickness direction of only up to 10 W/m·K has been obtained.

In addition, Patent Document 3 makes the following proposal. Two kinds of hBN agglomerated particles having different agglomeration strengths are used, and a heat conductivity in a thickness direction is increased by achieving closest packing through the deformation and collapse of the hBN agglomerated particle having a lower agglomeration strength at the time of molding with a press. In the proposal, however, the press molding needs to be performed under such a condition that the hBN agglomerated particle having a higher agglomeration strength does not break, and hence pressure control may be difficult.

CITATION LIST

Patent Document

[Patent Document 1] JP 2003-60134 A
[Patent Document 2] JP 2009-24126 A
[Patent Document 3] JP 2011-6586 A

SUMMARY OF INVENTION

Technical Problem

In view of the above-mentioned circumstances, an object of the present invention is to provide a curable heat radiation composition that has a high heat conductivity and a low void content, and hence is excellent in heat radiation property in its thickness direction, has a wide tolerance range (margin) for pressure molding conditions, and at the same time, can be used as an adhesive for an electronic component or electrical component, and an adhesive sheet using the composition.

Solution to Problem

As a result of their extensive studies, the inventors of the present invention have found that a curable heat radiation composition having a high heat conductivity in its thickness direction and a low void content is obtained by blending a thermosetting resin with a filler (A) having a higher compressive breaking strength and a filler (B) having a lower compressive breaking strength so that a constant compressive breaking strength ratio may be obtained, and have completed the present invention.

A heat-curable heat radiation composition of the present invention achieves a particularly high heat conductivity in its thickness direction probably because of the following reason. At the time of its pressure molding, the filler (B) having a lower compressive breaking strength is deformed or broken by the filler (A) having a higher compressive breaking strength, and an area of contact between the filler (A) having a higher compressive breaking strength and the filler (B) having a lower compressive breaking strength that has broken or deformed enlarges, and hence an effective heat transfer path route is formed. Further, substantial heat radiation property markedly improves probably because the void content reduces by virtue of such blending.

That is, the present invention provides curable heat radiation compositions according to the following items [1] to [11], an adhesive sheet according to the following item [12], methods of producing an adhesive sheet according to the following items [13] and [14], and heat radiation cured products according to the following items [15] and [16].

[1] A curable heat radiation composition, comprising two kinds of fillers having different compressive breaking strengths (provided that the case where the two kinds of fillers are the same substance is excluded), and a thermosetting resin (C), wherein a compressive breaking strength ratio between the two kinds of fillers [compressive breaking strength of a filler (A) having a higher compressive breaking strength/compressive breaking strength of a filler (B) having a lower compressive breaking strength] is from 5 to 1,500.

[2] The curable heat radiation composition according to [1] above, wherein the compressive breaking strength of the filler (A) having a higher compressive breaking strength is from 100 to 1,500 MPa, and the compressive breaking strength of the filler (B) having a lower compressive breaking strength is from 1.0 to 20 MPa.

[3] The curable heat radiation composition according to [2] above, wherein the filler (A) is aluminum nitride or alumina.

[4] The curable heat radiation composition according to [2] above, wherein the filler (B) is a hexagonal boron nitride agglomerated particle.

[5] The curable heat radiation composition according to the item 1, further including another inorganic filler in addition to the two kinds of fillers.

[6] The curable heat radiation composition according to [5] above, wherein the other inorganic filler is selected from aluminum hydroxide, fumed silica, and titanium oxide.

[7] The curable heat radiation composition according to any one of [1] to [6] above, wherein the total content of the filler (A) having a higher compressive breaking strength and the filler (B) having a lower compressive breaking strength is from 50 to 95 mass %; or the total content of the filler (A) having a higher compressive breaking strength, the filler (B) having a lower compressive breaking strength, and the other inorganic filler is from 50 to 95 mass %; and the mass ratio [(A)/(B)] of the filler (A) having a higher compressive breaking strength to the filler (B) having a lower compressive breaking strength falls within the range of from 0.1 to 10.

[8] The curable heat radiation composition according to [1] above, further including a thermoplastic resin (D), wherein the content of the thermosetting resin (C) is from 70 to 95 parts by mass with respect to a total of 100 parts by mass of the thermosetting resin (C) and the thermoplastic resin (D).

[9] The curable heat radiation composition according to [8] above, wherein the thermosetting resin (C) contains a first thermosetting resin (C-1) having three or more reactive groups of at least one kind selected from an epoxy group and a (meth)acryloyl group in a molecule thereof, having a molecular weight per reactive group of less than 200, and having a number-average molecular weight of less than 1,000.

[10] The curable heat radiation composition according to [8] above, wherein the thermoplastic resin (D) contains at least one kind selected from a polyvinyl butyral resin and a polyester resin.

[11] The curable heat radiation composition according to any one of the [1] to [10] above, further containing a solvent.

[12] An adhesive sheet, comprising a supporting film, a covering film, and a film formed of the curable heat radiation resin composition according to any one of the items 1 to 11, the film being formed between the supporting film and the covering film.

[13] A production method for an adhesive sheet, comprising applying the curable heat radiation resin composition according to any one of [1] to [11] above to a supporting film, covering part or the entirety of the applied surface with a covering film to provide a laminate, and heating and pressing the laminate with a roll press.

[14] A production method for an adhesive sheet, comprising: applying the curable heat radiation resin composition according to any one of [1] to [11] above to each of two supporting films; attaching the applied surface of one of the supporting films and the applied surface of the other supporting film to each other to provide a laminate; and heating and pressing the laminate with a roll press.

[15] A heat radiation cured product, which is obtained by heating and molding the curable heat radiation composition according to any one of [1] to [11] above at a temperature in the range of from 70 to 200° C. and a pressure of from 1 to 100 MPa; and has a void content of 5% or less and a heat conductivity in its thickness direction of 10 W/m·K or more.

[16] A heat radiation cured product, which is obtained by heating and molding a laminate obtained by laminating a base material on an adhesive sheet obtained by the production method according to [13] or [14] above at a temperature in the range of from 70 to 200° C. and a pressure of from 0.1 to 10 MPa, and has a void content of 5% or less and a heat conductivity in its thickness direction of 10 W/m·K or more.

Advantageous Effects of Invention

The curable heat radiation composition according to one embodiment of the present invention can be used as an adhesive or sheet for fixing an electrical component in the field of, for example, a power semiconductor, a semiconductor element including an optical semiconductor, a semiconductor device, a metal plate for a circuit, a circuit formed of the metal plate, a circuit board, or a hybrid integrated circuit because the composition has excellent heat radiation property in its thickness direction.

BRIEF DESCRIPTION OF DRAWINGS

FIG. 1 is a schematic sectional view of a power module example using a curable heat radiation composition of the present invention.

FIG. 2 is a schematic sectional view of another power module example using the curable heat radiation composition of the present invention.

FIG. 3 is a schematic sectional view of another power module example using the curable heat radiation composition of the present invention.

FIG. 4 is a schematic sectional view of another power module example using the curable heat radiation composition of the present invention.

FIG. 5 is a schematic sectional view of a double-faced cooling power module using the curable heat radiation composition of the present invention.

MODE FOR CARRYING OUT THE INVENTION

Hereinafter, the present invention is described in detail.

Two kinds of fillers having different compressive breaking strengths are used in a curable heat radiation composition of the present invention. In the present invention, the compressive breaking strength of each filler can be measured with a microcompression testing machine manufactured by Shimadzu Corporation (such as an MCT-510). The testing machine can measure the breaking strength by: applying a test force to a particle of the filler fixed between an upper pressure terminal and a lower pressure plate at a constant increase ratio; and measuring the deformation amount of the filler. The compressive breaking strength can be calculated from the following equation (1) described in JIS R 1639-5 (2007).

$$Cs = 2.48 \times (P/\pi d^2) \quad (1)$$

In the equation, Cs represents the strength (MPa), P represents the test force (N), and d represents a particle diameter (mm).

In the curable heat radiation composition of the present invention including two kinds of fillers having different compressive breaking strengths and a thermosetting resin, a compressive breaking strength ratio between the two kinds of fillers [compressive breaking strength of a filler (A) having a higher compressive breaking strength/compressive breaking strength of a filler (B) having a lower compressive breaking strength] is preferably from 5 to 1,500, more preferably from 10 to 500. When the ratio exceeds 1,500, the filler having a lower compressive breaking strength is broken too much to form an efficient heat transfer path route. In addition, when the ratio is less than 5, the filler having a lower compressive breaking strength cannot be deformed or broken, and contact between the fillers becomes point contact, and hence it becomes difficult to form an efficient heat transfer path route.

The compressive breaking strength of the filler (A) having a higher compressive breaking strength in the present invention falls within the range of preferably from 100 to 1,500 MPa, more preferably from 150 to 800 MPa. When the compressive breaking strength exceeds 1,500 MPa, a molding machine such as a pressing machine may be damaged. When the compressive breaking strength is less than 100 MPa, the filler having a lower compressive breaking strength cannot be sufficiently deformed or broken, and hence sufficient heat radiation property cannot be obtained.

The compressive breaking strength of the filler (B) having a lower compressive breaking strength in the present invention falls within the range of preferably from 1.0 to 20 MPa, more preferably from 1.5 to 10 MPa. When the compressive breaking strength exceeds 20 MPa, sufficient deformation or breakage of the filler by the filler (A) having a higher compressive breaking strength does not occur, and hence high heat radiation property resulting from surface contact between the fillers cannot be obtained. In addition, when the compressive breaking strength is less than 1.5 MPa, the filler (B) having a lower compressive breaking strength breaks during a process for the dispersion of the fillers in the resin, and all fillers lie down in the surface direction of the composition film at the time of pressing, and hence it becomes difficult to form a target heat transfer path route in its thickness direction.

The average particle diameter of the filler (A) having a higher compressive breaking strength falls within the range of preferably from 20 to 100 μm, more preferably from 40 to 80 μm. When the average particle diameter is less than 20 μm, the filler (B) having a lower compressive breaking strength cannot be efficiently deformed or broken. When the average particle diameter exceeds 100 μm, smoothness is lost at the time of the application of the composition to a base material.

The average particle diameter of the filler (B) having a lower compressive breaking strength falls within the range of preferably from 10 to 120 μm, more preferably from 30 to 80 μm. When the average particle diameter is less than 10 μm, the filler (B) having a lower compressive breaking strength cannot be efficiently deformed or broken. When the average particle diameter exceeds 120 μm, smoothness is lost at the time of the application of the composition to a base material.

A ratio between the average particle diameters of the filler (A) having a higher compressive breaking strength and the filler (B) having a lower compressive breaking strength is preferably from 0.1 to 10, more preferably from 0.5 to 2.7.

The average particle diameter of each filler to be used in the present invention is a value obtained by measuring its particle size distribution by a laser diffraction/scattering method. Specifically, the particle size distribution can be measured by using a laser diffraction/scattering particle size distribution-measuring device manufactured by SEISHIN ENTERPRISE CO., LTD. (LMS-2000e). It should be noted that the average particle diameter represents the particle diameter at which an integrated value is 50% for a certain particle size distribution.

In the present invention, the total content of the fillers in the curable heat radiation composition excluding a volatile component falls within the range of preferably from 50 to 95 mass %, more preferably from 60 to 90 mass %. When the total content exceeds 95 mass %, the adhesiveness and strength of the composition reduce. On the other hand, when the total content is less than 50 mass %, sufficient heat radiation property is not obtained.

In addition, in the total filler amount in the curable heat radiation composition of the present invention, the mass ratio [(A)/(B)] of the filler (A) having a higher compressive breaking strength to the filler (B) having a lower compressive breaking strength in falls within the range of preferably from 0.1 to 10, more preferably from 1 to 5. When the mass ratio is less than 0.1, the deformation or breakage of the filler having a lower compressive breaking strength does not sufficiently occur, and hence the heat radiation property of the composition reduces. In addition, when the mass ratio exceeds 10, the amount of the filler (B) having a lower compressive breaking strength, which is to fill the voids of the composition through its deformation or breakage, reduces and hence the heat radiation property reduces.

In the present invention, examples of the filler (A) having a higher compressive breaking strength include alumina, aluminum nitride, glass beads, fused silica, and cubic boron nitride (cBN). Of those, aluminum nitride is particularly preferred because of its high heat conductivity (200 W/m·K).

Specific examples of the filler (A) having a higher compressive breaking strength include aluminum nitrides FAN-f50-J (average particle diameter: 50 μm) and FAN-f30 (average particle diameter: 30 μm) manufactured by FURUKAWA DENSHI CO., LTD. In addition, examples of the alumina include CB-A50S (average particle diameter: 50 μm), CB-A30S (average particle diameter: 28 μm), CB-A20S (average particle diameter: 21 μm), AS-10 (average particle diameter: 39 μm), AS-20 (average particle diameter: 22 μm), AL-17-1 (average particle diameter: 60 μm), AL-17-2 (average particle diameter: 60 μm), AL-13-H (average particle diameter: 60 µm), AL-13-M (average particle diameter: 60 µm), and AL-13KT (average particle diameter: 97 µm) manufactured by SHOWA DENKO K.K. Examples of the glass beads include J-320 (average particle diameter: 50 µm), GB301S (average particle diameter: 50 µm), GB301SA-PN (average particle diameter: 50 µm), GB301SB-PN (average particle diameter: 50 µm), and GB-301SC-PN (average particle diameter: 50 µm) manufactured by Potters-Ballotini Co., Ltd. Examples of the fused silica include FB-20D (average particle diameter: 23 µm) and FB-950 (average particle diameter: 24 µm) manufactured by DENKI KAGAKU KOGYO KABUSHIKI KAISHA.

Examples of the filler (B) having a lower compressive breaking strength include: an agglomerated particle of a metal oxide such as zinc oxide, iron oxide, titanium oxide, zirconium oxide, or silicon oxide; an agglomerated particle of a metal hydroxide such as nickel hydroxide or yttrium hydroxide; an agglomerated particle of a metal such as tantalum; an agglomerated particle of a salt such as calcium carbonate or lithium manganate; and a hexagonal boron nitride (hBN) agglomerated particle. Of those, an hBN agglomerated particle is preferred from the viewpoint of obtaining excellent heat radiation property.

Specific examples of the hBN agglomerated particle as the filler (B) having a lower compressive breaking strength include: UHP-2 manufactured by SHOWA DENKO K.K. (classified product of the hBN agglomerated particle); and PTX-60S (average particle diameter: 60 µm), PT-405 (average particle diameter: 40 µm), and TECO-20091045-B (average particle diameter: 60 µm) manufactured by Momentive Performance Materials Inc.

A thermosetting resin (C) to be used in the present invention is not particularly limited and a known thermosetting resin can be used. Specific examples of such thermosetting resin include an epoxy resin, a urethane resin, a phenol resin, a (meth)acryloyl group-containing resin, a vinyl ester resin, and a silicone resin. Of those, a resin containing an epoxy resin is preferred from the viewpoint of the adhesiveness with a base material. The term "(meth) acryloyl" as used herein means acryloyl or methacryloyl, or both of them. The term "(meth)acryl" as used herein similarly means acryl or methacryl, or both of them.

When the curable heat radiation composition of the present invention is used as a heat-conductive resin sheet for such a power semiconductor module as illustrated in any one of FIGS. 1 to 5, not only the adhesiveness with a base material but also heat resistance and a withstand voltage characteristic are required, and hence a resin component needs to be selected in accordance with the required characteristics.

First Thermosetting Resin (C-1):

A first thermosetting resin (C-1) to be used as the thermosetting resin of the present invention is a resin having three or more reactive groups of at least one kind selected from an epoxy group and a (meth)acryloyl group in a molecule thereof, having a molecular weight per reactive group of 80 or more and less than 200, and having a number-average molecular weight of 300 or more and less than 1,000. The thermosetting resin (C-1) is blended for the purpose of increasing a crosslink density after the curing of the curable heat radiation composition of the present invention to impart heat resistance and a withstand voltage to a cured product. When the number of the reactive groups in a molecule of the resin is less than three, or the molecular weight per reactive group is 200 or more, the crosslink density reduces and hence the heat resistance reduces. In addition, when the number-average molecular weight exceeds 1,000, the flowability of the resin composition reduces and hence its moldability into a sheet reduces. As a result, the withstand voltage reduces owing to the occurrence of a microcrack or the presence of a void.

Examples of the resin having an epoxy group serving as the thermosetting resin (C-1) include a glycidylamine-type epoxy resin, a heterocyclic epoxy resin, and a tri- or higher functional aromatic epoxy resin. Specific examples of the glycidylamine-type epoxy resin include N,N,N',N'-tetraglycidyl-4,4'-diaminodiphenylmethane (product name: EPOTOHTO YH-434L, NIPPON STEEL & SUMIKIN CHEMICAL CO., LTD.), N,N,N',N'-tetraglycidyl-1,3-benzenedi (methaneamine) (product name: TETRAD-X, MITSUBISHI GAS CHEMICAL COMPANY, INC.), 4-(glycidyloxy)-N,N-diglycidylaniline and 3-(glycidyloxy)-N,N-diglycidylaniline. A specific example of the heterocyclic epoxy resin can be triglycidyl isocyanurate (product name: TEPIC-S, NISSAN CHEMICAL INDUSTRIES, LTD.). Specific examples of the tri- or higher functional aromatic epoxy resin include a tetrafunctional naphthalene-type epoxy resin (product name: EPICLON HP-4700, DIC Corporation) and a triphenylmethane-type epoxy resin (product name: 1032H60, Mitsubishi Chemical Corporation).

Examples of the resin having a (meth)acryloyl group include a (meth)acrylic acid ester of polyol having three or more hydroxy groups in a molecule thereof and a heterocyclic (meth)acrylate. Specific examples of the (meth) acrylic acid ester of polyol having three or more hydroxy groups in a molecule thereof can include trimethylolpropane tri(meth)acrylate, pentaerythritol tri(meth)acrylate, pentaerythritol tetra(meth)acrylate, dipentaerythritol pentaacrylate, and dipentaerythritol hexaacrylate. Specific examples of the heterocyclic (meth)acrylate can include tris(2-acryloyloxyethyl) isocyanurate and tris(2-methacryloyloxyethyl) isocyanurate.

Target performance can be expressed by incorporating the thermosetting resin (C-1) at a content of from 25 to 60 mass % in the resin components. The content is more preferably from 30 to 50 mass %. When the content is less than 25 mass %, the heat resistance and the withstand voltage characteristic reduce. When the content exceeds 60 mass %, the flexibility of the cured product reduces.

Second Thermosetting Resin (C-2):

A thermosetting resin (C-2) to be used in the present invention is blended for the purpose of controlling the flowability of the curable heat radiation composition, and the adhesiveness and flexibility of the cured product. Examples of such resin include an epoxy resin except (C-1) and a resin having a (meth)acryloyl group. Of those, an epoxy resin is particularly preferred from the viewpoint of the adhesiveness as described in the foregoing.

Examples of the epoxy resin corresponding to the thermosetting resin (C-2) include a bifunctional glycidyl ether-type epoxy resin, a glycidyl ester-type epoxy resin, a polyfunctional epoxy resin that is not included in the thermosetting resin (C-1), and a linear aliphatic epoxy resin. Specific examples of the bifunctional glycidyl ether-type epoxy resin include a bisphenol A-type epoxy resin, a bisphenol F-type epoxy resin, a bisphenol S-type epoxy resin, a hydrogenated bisphenol A-type epoxy resin, and a biphenyl-type epoxy resin. Specific examples of the glycidyl ester-type epoxy resin include hexahydrophthalic acid glycidyl ester and dimer acid glycidyl ester. Specific examples of the polyfunctional epoxy resin that is not included in the thermosetting resin (C-1) include glycidyl ether-type epoxy resins such as a phenol novolac-type epoxy resin, a cresol novolac-type epoxy resin, a biphenyl aralkyl-type epoxy resin, and a naphthalene aralkyl-type epoxy resin. Specific examples of the linear aliphatic epoxy resin include linear aliphatic epoxy resins such as epoxidized polybutadiene and epoxidized soybean oil. One kind of the epoxy resins may be used alone, or two or more kinds thereof may be mixed and used.

Examples of the resin having a (meth)acryloyl group can include a (meth)acrylic acid ester of a diol compound and a (meth)acrylic acid ester of a caprolactone adduct of polyol. Specific examples of the (meth)acrylic acid ester of a diol compound include ethylene glycol di(meth)acrylate, 1,4-butanediol di(meth)acrylate, 1,6-hexanediol di(meth)acrylate, 1,9-nonanediol di(meth)acrylate, neopentyl glycol di(meth)acrylate, triethylene glycol di(meth)acrylate, and tripropylene glycol di(meth)acrylate. Specific examples of the (meth)acrylic acid ester of a caprolactone adduct of polyol include a (meth)acrylic acid ester of a pentaerythritol-caprolactone adduct and a (meth)acrylic acid ester of a dipentaerythritol-caprolactone adduct.

When epoxy resins are used as the thermosetting resins (C-1) and (C-2), a curing agent or a curing accelerator (curing catalyst) may be blended. Examples of the curing agent include: alicyclic acid anhydrides such as methyltetrahydrophthalic anhydride, methylhexahydrophthalic anhydride, and himic anhydride; aliphatic acid anhydrides such as dodecenylsuccinic anhydride; aromatic acid anhydrides such as phthalic anhydride and trimellitic anhydride; bisphenols such as 2,2-bis(4-hydroxyphenyl)propane (synonym: bisphenol A), 2-(3-hydroxyphenyl)-2-(4'-hydroxyphenyl)propane, bis(4-hydroxyphenyl)methane (synonym: bisphenol F), and bis(4-hydroxyphenyl) sulfone (synonym: bisphenol S); phenol resins such as a phenol-formaldehyde resin, a phenol-aralkyl resin, a naphthol-aralkyl resin, and a phenol-dicyclopentadiene copolymer resin; and organic dihydrazides such as dicyandiamide and adipic acid dihydrazide. Examples of the curing catalyst include: tris(dimethylaminomethyl)phenol; dimethylbenzylamine; 1,8-diazabicyclo(5,4,0)undecene and derivatives thereof; and imidazoles such as 2-methylimidazole, 2-ethyl-4-methylimidazole, and 2-phenylimidazole. One kind of those agents and catalysts can be used alone, or two or more kinds thereof can be used in combination.

When resins each having a (meth)acryloyl group are used as the thermosetting resins (C-1) and (C-2), an organic peroxide may be blended as the curing agent. Specific examples of such organic peroxide include diisopropyl peroxydicarbonate, t-butyl peroxy-2-ethylhexanoate, t-hexyl peroxy-2-ethylhexanoate, 1,1,3,3-tetramethylbutyl peroxy-2-ethylhexanoate, t-amyl peroxy-2-ethylhexanoate, lauryl peroxide, 1,1-bis(t-butylperoxy)-3,3,5-trimethylcyclohexanone, cyclohexanone peroxide, methyl ethyl ketone peroxide, dicumyl peroxide, t-butyl cumyl peroxide, and cumene hydroperoxide.

A resin component to be used in the curable heat radiation composition of the present invention is, for example, a thermoplastic resin (D). The thermoplastic resin imparts moderate flexibility to an uncured sheet or a cured sheet, and plays an important role in improving workability at the time of handling of such sheet, or as a stress-relaxing agent for the cured product. Specific examples of such thermoplastic resin include a polyvinyl butyral resin, a polyester resin, a phenoxy resin, and an acrylic copolymer. Of those, a polyvinyl butyral resin or a polyester resin is preferably used in the present invention from the viewpoint of a flexibility-imparting effect. The blending amount of such thermoplastic resin is preferably from 5 to 30 mass %, more preferably from 10 to 25 mass % in the resin components. When the blending amount is less than 5 mass %, the flexibility becomes insufficient. When the blending amount exceeds 30 mass %, the moldability of the composition deteriorates.

A coupling agent can be added to the curable heat radiation composition of the present invention for the purpose of improving the dispersibility of the inorganic fillers in the resin components and the adhesiveness with a base material. Examples of the coupling agent include a silane-based, titanate-based, and aluminum-based coupling agents. In the present invention, a silane-based coupling agent can be preferably used, and preferred specific examples thereof include γ-aminopropyltrimethoxysilane, γ-aminopropyltriethoxysilane, γ-(2-aminoethyl)aminopropyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane.

The curable heat radiation composition of the embodiment of the present invention can contain a solvent from the viewpoint of adjusting the viscosity of the composition. The solvent is not particularly limited, and a known solvent has only to be appropriately selected in accordance with the kinds of the thermosetting resin and inorganic fillers. Examples of such solvent include toluene, methyl ethyl ketone, and the like such as toluene, xylene, cyclohexane, isophorone, tetrahydrofuran, diethylene glycol dimethyl ether, ethylene glycol diethyl ether, propylene glycol methyl ether acetate, propylene glycol ethyl ether acetate, dipropylene glycol methyl ether acetate, diethylene glycol ethyl ether acetate, propylene glycol monomethyl ether, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, and cyclohexanone. One kind of those solvents can be used alone, or two or more kinds thereof can be used in combination.

The blending amount of the solvent in the curable heat radiation composition of the present invention is not particularly limited as long as the amount of the solvent enables kneading, and the amount is generally 30 parts by mass or more and 300 parts by mass or less with respect to a total sum of 100 parts by mass of the resins and inorganic fillers in the curable heat radiation composition.

In the curable heat radiation composition of the present invention, another inorganic filler can be blended for the purpose of controlling its characteristics except the heat radiation property within an amount which does not affect the heat radiation property. Examples of such inorganic filler include: aluminum hydroxide for imparting flame retardancy; fumed silica for controlling the flowability of the composition; and an inorganic pigment such as titanium oxide for coloring.

A production method for the curable heat radiation composition of this embodiment is not particularly limited, and the production can be performed in accordance with a known method. For example, the curable heat radiation composition of this embodiment can be produced as described below.

First, a predetermined amount of a curable resin and an amount of a curing agent or curing accelerator needed for curing the curable resin are mixed. Next, a solvent is added to the mixture as required, and then inorganic fillers, specifically the filler (A) having a higher breaking strength and the filler (B) having a lower breaking strength are added to the resultant, followed by preliminary mixing. The curable heat radiation composition can be provided by kneading the preliminary mixture with a planetary mixer. It should be noted that when the curable heat radiation composition is blended with a coupling agent, the coupling agent has only to be added before the kneading step.

Further, the curable heat radiation composition can be processed into a sheet shape by applying the composition to a base material as required and drying the solvent as required.

A cured product excellent in heat radiation property can be obtained by: mounting the curable heat radiation composition or sheet thus obtained on a base material; and curing the composition or sheet while being pressed at a predetermined press pressure. In general, when the resin is filled with the inorganic fillers at high concentration in order to improve the heat radiation property, a void occurs in the cured product and hence the press pressure in the pressing step needs to be increased. As described above, however, the two kinds of fillers having different breaking strengths are used in the curable heat radiation composition of the present invention. Accordingly, the filler (B) having a lower breaking strength that has deformed or broken enters a void portion, and hence no void occurs. As a result, the heat radiation curable composition of the present invention achieves high heat radiation property. The pressure at the time of the pressing for deforming or breaking the filler (B) having a lower breaking strength, and a temperature for controlling the flowability and curing of the composition are important for obtaining the high heat radiation property. The pressure falls within the range of preferably from 1 to 100 MPa, more preferably from 2 to 50 MPa. In the case where the pressure exceeds 100 MPa, the filler (A) having a higher breaking strength is also broken. In the case where the pressure is less than 1 MPa, the filler (B) having a lower breaking strength does not sufficiently deform or break. Accordingly, in each of the cases, the heat radiation property reduces. The temperature falls within the range of preferably from 70 to 200° C., more preferably from 90 to 180° C. When the temperature is more than 200° C., the resin components may decompose owing to oxidation or the like. When the temperature is less than 70° C., the flowability of the composition becomes insufficient and hence the flatness of the cured product to be obtained cannot be secured. At the same time, the curing does not progress. When the curable heat radiation composition of the present invention is cured under such conditions, the resultant cured product has a void content as low as 5% or less.

Next, the case where the curable heat radiation composition of the present invention is processed into an adhesive sheet before use is described.

When the curable heat radiation composition is processed into an adhesive sheet, the curable heat radiation composition dispersed and/or dissolved in an organic solvent (curable heat radiation composition liquid) is used in consideration of applicability. The curable heat radiation composition liquid is applied to a supporting film with an applying apparatus such as an applicator or a knife coater, and then the organic solvent is dried by heating the liquid. A drying temperature is preferably from 40 to 150° C., more preferably from 50 to 120° C. When the temperature is less than 40° C., the organic solvent remains. When the temperature exceeds 150° C., the reaction of the curable resin component excessively progresses. A thickness after the drying of the solvent falls within the range of preferably from 30 to 500 μm, more preferably from 50 to 300 μm. When the thickness is less than 30 μm, the flatness of an applied film is lost owing to the influences of the particle diameters of the fillers to be used. When the thickness exceeds 500 μm, the organic solvent remains to adversely affect the heat conductivity of the sheet and the physical properties of the cured product.

Although a production method for the adhesive sheet is not particularly limited, the adhesive sheet can be obtained by a method comprising: applying the curable heat radiation composition liquid to the supporting film to form a sheet; covering part or the entirety of the applied surface of the sheet with a covering film to provide a laminate; and heating and pressing the laminate under the above-mentioned conditions. In addition, when the thickness of a curable heat radiation composition layer needs to be increased, there is employed, for example, a method comprising: applying the curable heat radiation composition liquid to each of two supporting films; attaching the applied surface of one of the supporting films and the applied surface of the other supporting film to each other to provide a laminate; and heating and pressing the laminate under the above-mentioned conditions.

When the adhesive sheet is produced, it is preferred that the filler (B) having a lower breaking strength be deformed or broken in the heating-pressing step, and the filler (B) having a lower breaking strength that has been broken be filled into a void to provide a high heat conductivity. As a result, an electronic component can be adhered at a low pressure at the time of its mounting.

A heating condition when an adhesive sheet in which the filler (B) having a lower breaking strength has broken or deformed is produced is as follows: the temperature is preferably equal to or more than the softening point of each resin component to be used, specifically from 50 to 150° C., more preferably from 70 to 120° C. When the temperature is less than 50° C., the resin does not soften and hence the shape of the filler (B) having a lower breaking strength remains as it is. Accordingly, the heat conductivity of the sheet deteriorates. When the temperature exceeds 150° C., the reaction of the curable resin component progresses so much that an electronic component cannot be adhered at the time of its mounting. In addition, a pressure condition at that time is preferably from 1 to 100 MPa, more preferably from 2 to 50 MPa. When the pressure is less than 1 MPa, the shape of the filler (B) having a lower breaking strength remains as it is, and hence the heat conductivity deteriorates. When the pressure exceeds 100 MPa, most of the filler (B) having a lower breaking strength is broken. Moreover, for example, when a hexagonal boron nitride agglomerated particle is used, flat primary particles of hexagonal boron nitride are oriented in the in-plane direction of the sheet and hence the heat conductivity in its thickness direction reduces.

A batch-type pressing machine can be used as means of the heating and pressing at the time of producing the adhesive sheet. A preferred apparatus can be, for example, a roll press capable of continuous heating and pressing in consideration of productivity. A line speed when the roll press is used is preferably from 0.1 to 5 m/min, more preferably from 0.3 to 3 m/min. When the line speed is less than 0.1 m/min, the productivity is low. When the line speed exceeds 5 m/min, the breakage of the filler (B) having a lower breaking strength is insufficient and hence the heat conductivity in the thickness direction reduces.

The supporting film to be used when the adhesive sheet is produced can be selected depending on an intended purpose of the adhesive sheet, and examples thereof can include: a metal foil made of copper, aluminum, or the like; and a polymer film made of polypropylene, polycarbonate, polyethylene naphthalate, polyethylene terephthalate, polytetrafluoroethylene, polyphenylene sulfide, polyvinylidene fluoride, polyimide, or the like. When the polymer film is used, the film may be subjected to release treatment before use in order that its releasability from the curable heat radiation composition may be improved. The covering film to be used at the time of producing the adhesive sheet of the present invention can be selected from the examples of the supporting film. The thickness of each of the supporting film and the covering film is preferably from 10 to 200 µm.

A cured product excellent in heat radiation property can be obtained by: mounting the adhesive sheet thus obtained on a base material; and heating and curing the sheet while pressing the sheet at a predetermined press pressure. In addition, when an electronic component is adhered, the adhesion can be performed by: peeling at least one supporting film; attaching the electronic component to a curable heat radiation resin surface after the peeling; and heating and pressing the resultant to cure the same. When the electronic component is adhered, the electronic component fractures at an excessively large pressure. Accordingly, a pressure needs to be set to fall within such a range that the electronic component can be adhered without being fractured.

When the adhesive sheet of the present invention is used in the adhesion of an electronic component, the sheet is pressed and heated under such conditions that only the adhesion occurs. A pressure falls within the range of preferably from 0.1 to 10 MPa, more preferably from 0.5 to 8 MPa. When the pressure is less than 0.1 MPa, the electronic component is not adhered. When the pressure exceeds 10 MPa, the electronic component may break. A temperature falls within the range of preferably from 70 to 200° C., more preferably from 90 to 180° C. When the temperature is more than 200° C., the resin components may decompose owing to oxidation or the like. When the temperature is less than 70° C., the flowability of the composition becomes insufficient and hence the electronic component is not adhered.

In the present invention, the heat conductivity of the cured product in its thickness direction is measured in conformity with a method specified in the "method of testing fine ceramics for its thermal diffusivity, specific heat, and heat conductivity by laser flash method: JIS R 1611 (2010)." Specifically, a test piece measuring about 10 mm by 10 mm was cut out of a test piece having a thickness of from 200 to 500 µm obtained by curing the curable heat radiation composition of the present invention, and its thermal diffusivity at 25° C. was measured by using a heat conductivity-measuring apparatus LFA447 NanoFlash (manufactured by NETZSCH). Further, its heat conductivity was calculated from its specific heat separately determined by a DSC method and its density by using the following equation (2).

$$\text{Heat conductivity (W/m·K)} = \text{thermal diffusivity} \times \text{specific heat} \times \text{specific gravity} \quad (2)$$

Curing each of the curable heat radiation composition of the present invention and the sheet produced from the composition provides a heat conductivity in a thickness direction of 10 W/m·K or more.

The curable heat radiation composition of the present invention can be used as an adhesive having high heat radiation property, adhesiveness after curing, and long-term reliability in fixing an electrical component such as a power semiconductor, a semiconductor element including an optical semiconductor, a semiconductor device, a metal plate for a circuit, a circuit formed of the metal plate, a circuit board, or a hybrid integrated circuit.

An example in which the curable heat radiation composition of the present invention is used in the application of a power semiconductor is described below.

The curable heat radiation composition of the present invention can be suitably used in, for example, a heat-conductive resin sheet for a power module described in JP 2005-232313 A.

FIGS. 1, 2, and 3 are schematic sectional views of power modules corresponding to FIGS. 4, 5, and 7 of JP 2005-232313 A, respectively.

A power module (10) of FIG. 1 has the following structure. A power semiconductor element (2) is mounted on one surface of a lead frame (1a) and a heat sink member (4) is provided on the surface of the lead frame (1a) opposite to the surface on which the power semiconductor element (2) is mounted through a cured body (3) of a heat-conductive resin sheet. The power semiconductor element (2) is connected to a control semiconductor element (5) mounted on a lead frame (1b) by a metal wire (6), and power module-constituting members such as the heat-conductive resin sheet (3), the lead frames (1a, 1b), the heat sink member (4), the power semiconductor element (2), the control semiconductor element (5), and the metal wire (6) are encapsulated with a mold resin (7). However, the portion of each lead frame (1a, 1b) to be connected to an external circuit and the surface of the heat sink member (4) opposite to the surface adhering to the heat-conductive resin sheet (3) are not covered with the mold resin (7).

A power module (20) of FIG. 2 has such a structure that the heat sink member (4) is embedded in the cured body (3) of the heat-conductive resin sheet in the power module of FIG. 1.

FIG. 3 illustrates a casing-type power module (30), and the power module is formed of: a heat sink member (14) formed of an inorganic insulating plate; a circuit board (12) formed on the surface of the heat sink member (14); a power semiconductor (13) mounted on the circuit board (12); a casing (15) adhered to the peripheral portion of the heat sink member (14); a mold resin (16) for encapsulating the circuit board (12), power semiconductor (13) and the like in the case; a cured body (11) of a heat-conductive resin sheet laminated on the surface of the heat sink member (14) opposite to the surface on which the circuit board (12) is provided; and a heat spreader (17) joined to the heat sink member (14) through the cured body (11) of the heat-conductive resin sheet.

When the curable heat radiation composition of the present invention is used in the heat-conductive resin sheet for any one of the power modules of FIGS. 1 to 3, the curable heat radiation composition of the present invention is applied to a metal plate serving as the heat sink (4 of each of FIGS. 1 and 2) or as the heat spreader (17 of FIG. 3) so as to have a target thickness, followed by solvent drying, and in some cases, moving to the B-stage, and a needed member is adhered to a layer formed of the curable heat radiation composition. Alternatively, the needed member may be adhered after the curable heat radiation composition formed into a sheet in advance has been attached and adhered to the heat sink (4) or the heat spreader (17).

Further, the curable heat radiation composition of the present invention can be suitably used as a highly heat-conductive insulating sheet for a power module (40) of a structure illustrated in FIG. 4.

The power module (40) of FIG. 4 has the following structure. A metal heat spreader (24) is fixed onto a metal foil (22) with a heat-conductive resin sheet (23) according to the present invention, and power semiconductor elements (25, 26) are soldered (27) onto the heat spreader (24). The power semiconductor elements (25, 26) are connected to lead frames (21a, 21b) through a metal wire (28), and the heat spreader (24), the power semiconductor elements (25, 26), the metal wire (28), and the portions of the lead frames (21a, 21b) connected to the metal wire (28) are encapsulated with a mold resin (29).

When the curable heat radiation composition of the present invention is used as the highly heat-conductive insulating sheet (23) for the power module of FIG. 4, the curable heat radiation composition of the present invention is applied onto the metal foil (22) so as to have a target thickness, followed by solvent drying, and in some cases, moving to the B-stage, and a needed member such as the heat, spreader (24) is adhered to a layer formed of the curable heat radiation composition. Alternatively, the needed member such as the heat spreader may be adhered after the curable heat radiation composition formed into a sheet in advance has been attached and adhered to the metal foil.

Another method of using the composition as the highly heat-conductive sheet for the power module illustrated in FIG. 4 is as described below. The curable heat radiation composition of the present invention is applied to each of both the metal foil and the metal heat spreader so as to have a target thickness, followed by solvent drying, and in some cases, moving to the B-stage, and the surfaces of the metal foil and the metal heat spreader on which the curable heat radiation composition layer is formed are attached and adhered to each other by heating and pressing the surfaces on which the curable heat radiation composition layer is formed. Further, a needed member may be adhered onto the heat spreader.

A metal which is excellent in heat conductivity such as copper or aluminum is suitably used as a material for the heat spreader, heat sink, or metal foil to be used in the power module of FIG. 4.

Further, the curable heat radiation composition of the present invention can be suitably used as a highly heat-conductive insulating resin adhesive sheet (38) for such a double-faced cooling semiconductor device as illustrated in FIG. 5. In FIG. 5, reference number 30 represents a power conductor element, reference number 31 represents solder, reference number 32 represents a metal heat-conductive spacer, reference number 33a represents a metal heat transfer plate, reference number 33b represents a protruded terminal portion, reference number 34 represents a control electrode terminal portion, reference number 35 represents a refrigerant tube, reference number 36 represents a bonding wire, and reference number 37 represents a mold resin. The metal heat transfer plate (33a) and the refrigerant tube (35) are joined through the highly heat-conductive insulating resin adhesive sheet (cured body) (38) using the curable heat radiation composition of the present invention, and the heat of the metal power conductor element (30) is efficiently conducted from the heat transfer plate (33a) to the refrigerant tube.

EXAMPLES

The present invention is described below by way of Examples and Comparative Examples. However, the present invention is not limited Examples below.

Filler and its Compressive Breaking Strength:
[Filler (A)]
Any one of the following fillers was used as the filler (A) having a higher compressive breaking strength.

(1) CB-A50S: spherical alumina having an average particle diameter of 50 μm manufactured by SHOWA DENKO K.K.
(2) FAN-f50-J: aluminum nitride having an average particle diameter of 50 μm manufactured by FURUKAWA DENSHI CO., LTD.
(3) GB301S: glass beads having an average particle diameter of 50 μm manufactured by Potters-Ballotini Co., Ltd.
(4) HIGILITE HT-32I: aluminum hydroxide having an average particle diameter of 8 μm manufactured by SHOWA DENKO K.K.

[Filler (B)]
Any one of the following fillers was used as the filler (B) having a lower compressive breaking strength.

(1) UHP-2: hBN agglomerated particle classified product manufactured by SHOWA DENKO K.K.
(2) PTX-60S: hBN agglomerated particle having an average particle diameter of 60 μm manufactured by Momentive Performance Materials Inc.
(3) PT-405: hBN agglomerated particle having an average particle diameter of 40 μm manufactured by Momentive Performance Materials Inc.
(4) TECO-20091045-B: hBN agglomerated particle having an average particle diameter of 63 μm manufactured by Momentive Performance Materials Inc.

The compressive breaking strength of each filler was measured by the above-mentioned method with a micro-compression testing machine MCT-510 manufactured by Shimadzu Corporation. Table 1 shows the results.

TABLE 1

| Kind of filler | Compressive breaking strength (MPa) |
| --- | --- |
| UHP-2 | 8.16 |
| PTX-60S | 3.91 |
| PT-405 | 2.53 |
| TECO-20091045-B | 2.82 |
| CB-A50S | 347.5 |
| FAN-f50-J | 278.8 |
| GB301S | 753.9 |

Resin Components:
[Thermosetting Resin (C-1)]
(1) Epoxy resin 1: tetrafunctional epoxy resin, number-average molecular weight: 420, epoxy equivalent: 118 g/eq, manufactured by NIPPON STEEL & SUMIKIN CHEMICAL CO., LTD., product name: EPOTOHTO YH-434L
(2) Epoxy resin 2: tetrafunctional naphthalene-type epoxy resin, number-average molecular weight: 560, epoxy group equivalent: 166 g/eq, manufactured by DIC Corporation, product name: EPICLON HP-4700
(3) Acrylic resin 1: trifunctional acrylic resin, number-average molecular weight: 423, functional group equivalent: 141 g/eq, manufactured by Hitachi Chemical Co., Ltd., product name: FANCRYL FA-731A

[Thermosetting Resin (C-2)]
(1) Epoxy resin 3: bisphenol A-type epoxy resin, epoxy equivalent: 190 g/eq, manufactured by NIPPON STEEL & SUMIKIN CHEMICAL CO., LTD., product name: EPOTOHTO YD-128
(2) Epoxy resin 4: bisphenol F-type epoxy resin, epoxy equivalent: 160 g/eq, manufactured by NIPPON STEEL & SUMIKIN CHEMICAL CO., LTD., product name: EPOTOHTO YDF-870GS
(3) Epoxy resin 5: polyfunctional epoxy resin, number-average molecular weight: 1,280, epoxy equivalent: 218 g/eq, manufactured by DIC Corporation, product name: EPICLON N-680

(4) Epoxy resin 6: polyfunctional epoxy resin, number-average molecular weight: 400, epoxy equivalent: 250 g/eq, manufactured by DIC Corporation, product name: EPICLON HP-7200L (5) Acrylic resin 2: hexafunctional acrylic resin, number-average molecular weight: 1,260, functional group equivalent: 141 g/eq, manufactured by Nippon Kayaku Co., Ltd., product name: KAYARAD DPCA-60

[Thermoplastic Resin (D)]

(1) Polyvinyl butyral resin: number-average molecular weight: 53,000, manufactured by SEKISUI CHEMICAL CO., LTD., product name: S-LEC SV-02

(2) Polyester resin: number-average molecular weight: 22,000, manufactured by The Nippon Synthetic Chemical Industry Co., Ltd., product name: SP182

[Other Thermosetting Resin]

(1) Phenol resin: polyfunctional phenol resin, number-average molecular weight: 470, hydroxy group equivalent: 108 g/eq, manufactured by NIPPON STEEL & SUMIKIN CHEMICAL CO., LTD., product name: SN-395

(2) Phenol resin: phenol novolac resin, SHOWA DENKO K.K., product name: SHONOL BRN-5834Y

[Curing Catalyst]

(1) Imidazole compound: 1-(cyanoethyl)-2-undecylimidazole, manufactured by SHIKOKU CHEMICALS CORPORATION, product name: CUREZOL C11Z-CN (2) Organic peroxide: cumene hydroperoxide, manufactured by NOF CORPORATION, product name: PERCUMYL H-80

Method of Analyzing Resin Component:
[Number-Average Molecular Weight]

Measurement was performed by employing gel permeation chromatography. It should be noted that a Shodex GPC System-21 manufactured by SHOWA DENKO K.K. (column: KF-802, KF-803, and KF-805) was used for the measurement, and the measurement was performed under the following conditions: a column temperature was set to 40° C., tetrahydrofuran was used as an eluent, and an elution rate was set to 1 ml/min. The result was represented by a molecular weight (Mw) in terms of standard polystyrene.

Method of Evaluating Molded Product:
[Density (Specific Gravity)]

The specific gravities of molded products measured in all of Examples and Comparative Examples were calculated as described below. The mass of a molded body in air and the mass of the molded body in water were measured with an electronic balance (CP224S) and specific gravity/density-measuring kit (YDK01/YDK01-0D/YDK01LP) manufactured by Sartorius Mechatronics Japan K.K., and its specific gravity was calculated by using the following equation (3).

$$\rho = W(a) \times \rho(fl) / \{W(a) - W(fl)\} \quad (3)$$

In the equation, $\rho$ represents the specific gravity of a solid, $\rho(fl)$ represents the density of a liquid, $W(a)$ represents the mass of the solid in air, and $W(fl)$ represents the mass of the solid in the liquid, and water is always used as the liquid for density measurement.

[Heat Conductivity]

A molded product having a thickness of from 200 to 500 μm produced by using a curable heat radiation composition was cut into a piece measuring 10 mm by 10 mm, and its thermal diffusivity at 25° C. was measured by using a heat conductivity-measuring apparatus LFA447 NanoFlash (manufactured by NETZSCH). Further, its heat conductivity was calculated from its specific heat and specific gravity, which had been separately determined, by using the following equation (2).

$$\text{Heat conductivity (W/m·K)} = \text{thermal diffusivity} \times \text{specific heat} \times \text{specific gravity} \quad (2)$$

[Void Content]

With regard to the void content of a molded body, the theoretical specific gravity of the molded body is calculated from the percentages by mass of the resin and respective fillers described in each of Examples and Comparative Examples. In addition, the specific gravity of the molded body actually molded is calculated from the equation (3). The void content was calculated from those numerical values by using the following equation (4).

$$\text{Void content (\%)} = 100 - (\text{specific gravity of molded body} / \text{theoretical specific gravity} \times 100) \quad (4)$$

Example 1

17.6 Parts by mass of a bisphenol A-type epoxy resin (product name: EPOTOHTO YD-128, manufactured by NIPPON STEEL & SUMIKIN CHEMICAL CO., LTD.), 66.5 parts by mass of a boron nitride agglomerated particle (UHP-2 manufactured by SHOWA DENKO K.K.) as a filler having a lower compressive breaking strength, and 15.9 parts by mass of aluminum nitride (FAN-f50-J manufactured by FURUKAWA DENSHI CO., LTD.) as a filler having a higher compressive breaking strength were blended and then kneaded with a rotation/revolution mixer (Awatori Rentaro manufactured by THINKY) to provide a target curable heat radiation resin composition. The curable heat radiation resin composition was heated and molded into a sheet shape with a heat press at a predetermined pressure (10 MPa) and 130° C. for 30 minutes, and the sheet was cured to produce a molded cured plate, followed by the measurement of its heat conductivity. As a result, the cured plate showed a heat conductivity in its thickness direction as high as 16.4 W/m·K. In addition, the void content of the molded body calculated by the above-mentioned method was 0.20%.

Examples 2 to 12

Curable heat radiation compositions and molded cured plates were produced according to compositions shown in Table 2 by the same method as that of Example 1, and their heat conductivities were measured and their void contents were calculated. Table 2 shows the results.

Comparative Examples 1 to 5

Curable heat radiation compositions and molded cured plates were produced according to compositions shown in Table 3 by the same method as that of Example 1, and their heat conductivities were measured and their void contents were calculated. Table 3 shows the results.

Example 13: Sheet Production (1)

As shown in Table 4, 150 parts by mass of propylene glycol monomethyl ether (manufactured by Wako Pure Chemical Industries, Ltd.) were added as a solvent to 35 parts by mass of N,N,N',N'-tetraglycidyl-4,4'-diaminodiphenylmethane (product name: YH-434L, manufactured by NIPPON STEEL & SUMIKIN CHEMICAL CO., LTD.) as the component (C-1), 10 parts by mass of a bisphenol A-type epoxy resin (product name: EPOTOHTO YD-128, manufactured by NIPPON STEEL & SUMIKIN CHEMICAL CO., LTD.) as the component (C-2), 25 parts by mass of a polyvinyl butyral resin (product name: S-LEC SV-02, SEKISUI CHEMICAL CO., LTD.) as the thermoplastic resin component (D), 10 parts by mass of a phenol novolac resin (product name: SHONOL BRN-3824Y, manufactured by SHOWA DENKO K.K.), and 20 parts by mass of a polyfunctional phenol resin (product name: SN-395, manufactured by NIPPON STEEL & SUMIKIN CHEMICAL CO., LTD.) to dissolve the resin components. Further, 0.3 part by mass of 1-(cyanoethyl)-2-undecylimidazole (product name: CUREZOL C11Z-CN, SHIKOKU CHEMICALS CORPORATION) was added as a curing catalyst to the solution. The prepared resin solution was blended with 309 parts by mass of aluminum nitride (product name: FAN-f50-J, manufactured by FURUKAWA DENSHI CO., LTD.) as the filler (A) having a higher compressive breaking strength, 71 parts by mass of a boron nitride agglomerated particle (product name: TECO-20091045-B, manufactured by Momentive Performance Materials Inc.) as the filler (B) having a lower compressive breaking strength, and 650 parts by mass of propylene glycol monomethyl ether as a solvent, and the mixture was kneaded with a rotation/revolution mixer (Awatori Rentaro manufactured by THINKY) to provide a curable heat radiation composition of Example 13.

The curable heat radiation composition thus prepared was applied to a PET film having a thickness of 75 μm with an automatic bar coater (PI-1210 manufactured by TESTER SANGYO CO., LTD.) so that an applied film after solvent drying had a thickness of about 150 μm, and the solvent was dried at normal pressure and 70° C. for 20 minutes and then in a vacuum at 70° C. for 20 minutes. Thus, a sheet in which the applied film of the heat radiation curable composition was formed on the PET film was obtained. The surfaces of the sheets on which the heat radiation curable composition was formed were attached to each other, and the resultant was heated and pressed three times with a desktop small roll press (manufactured by TESTER SANGYO CO., LTD.) under the conditions of a temperature of 90° C., a pressing pressure of 10 MPa, and a roll speed of 0.3 m/min to provide an adhesive sheet of Example 13 having a thickness of about 200 μm.

Example 14: Sheet Production (2)

An adhesive sheet was produced with a curable heat radiation composition having the same formulation as that of Example 13 by the following method.

The curable heat radiation composition was applied to a PET film having a thickness of 75 μm with an automatic bar coater (PI-1210 manufactured by TESTER SANGYO CO., LTD.) so that an applied film after solvent drying had a thickness of about 300 μm, and the solvent was dried at normal pressure and 70° C. for 20 minutes and then in a vacuum at 70° C. for 20 minutes. Thus, a sheet in which the applied film of the heat radiation curable composition was formed on the PET film was obtained. The sheet was covered with a PET film, and the resultant was heated and pressed three times with a desktop small roll press (manufactured by TESTER SANGYO CO., LTD.) under the conditions of a temperature of 90° C., a pressing pressure of 10 MPa, and a roll speed of 0.3 m/min to provide an adhesive sheet of Example 14 having a thickness of about 200 μm.

Examples 15 to 22 and Comparative Examples 6 to 12

Adhesive sheets of Examples 15 to 22 and Comparative Examples 6 to 12 each having a thickness of about 200 μm were produced according to formulations shown in Tables 4 and 5 by the same method as that of Example 13.

Evaluation Test of Adhesive Sheet:

Each of the adhesive sheets produced in Examples 13 to 22 and Comparative Examples 6 to 12 was measured for its dielectric breakdown voltage, glass transition temperature, workability, moldability, flexibility, adhesiveness, withstand voltage, heat conductivity, and void content by the following methods. Tables 4 and 5 collectively show the results.

[Method of Measuring Dielectric Breakdown Voltage]

The following cycle is performed: after the voltage of an AC power source having a frequency of 50 Hz has been increased to 5 kV at a rate of 5 kV/min, the voltage is held for 1 minute and reduced to 0 kV at a rate of 5 kV/min. When a current of 1 mA or more was confirmed to pass during the cycle, it was judged that dielectric breakdown occurred. It should be noted that a withstand voltage/insulation resistance-measuring apparatus TOS9201 manufactured by KIKUSUI ELECTRONICS CORPORATION was used in the test, and a cylinder having a diameter of 25 mm or a cylindrical product having a diameter of 75 mm was used as an electrode.

[Glass Transition Temperature After Curing]

Twenty-five adhesive sheets produced by a predetermined method were loaded into a 20-mm square mold in a state of being laminated, and were subjected to press curing at a temperature of 180° C. and a pressure of 3 MPa. The resultant molded product was subjected to cutting in the surface direction of the sheets so as to achieve the height of a test piece to be obtained. Thus, a 5-mm square test piece having a height of 10 mm was obtained. The glass transition temperature of the test piece was measured by a TMA method. Conditions for the measurement are as follows: a rate of temperature increase of 10 K/min and a load of 5 g. An EXSTAR TMA/SS7000 manufactured by SII NanoTechnology Inc. was used as a measuring apparatus.

[Workability]

An adhesive sheet produced by a predetermined method was stored at 23° C. After that, releasability from a supporting film and the flexibility of a sheet before curing were confirmed. The releasability was judged by the presence or absence of the fracture of the sheet when the supporting film was peeled. The flexibility was judged by the presence or absence of the fracture of the sheet when the sheet before curing was wound around a cylinder having a diameter of 50 mm in a state of having the supporting film attached thereto. The case where the sheet did not fracture was rated as ○ and the case where the sheet fractured was rated as ×.

[Moldability]

An adhesive sheet produced by a predetermined method was cut into a piece measuring 50 mm by 50 mm, and a supporting film was peeled. The resultant was subjected to press curing at a temperature of 180° C. and a pressure of 3 MPa in a state of being sandwiched between an electrolytic copper foil measuring 70 mm by 70 mm by 35 μm and an electrolytic copper foil measuring 40 mm by 40 mm by 35 μm. It was confirmed for the resultant single-sided copper-clad sheet that the copper foil was buried in the sheet and no crack occurred around the buried copper foil. With regard to the presence or absence of a crack, it was assumed that there was crack generation in the sheet when a dielectric breakdown voltage test was performed and a sheet in which current passage was confirmed at less than 1.0 kV. The case where no crack occurred was rated as ○ and the case where a crack occurred was rated as ×.

[Flexibility]

An adhesive sheet produced by a predetermined method was cut into a piece measuring 50 mm by 50 mm, and a supporting film was peeled. The resultant was subjected to press curing at a temperature of 180° C. and a pressure of 3

MPa in a state of being sandwiched between electrolytic copper foils each measuring 70 mm by 70 mm by 35 µm. A single-sided copper-clad sheet was produced by peeling the copper foil from only one side of the resultant double-sided copper-clad sheet. The single-sided copper-clad sheet was wound around a cylinder having a diameter of 100 mm in a state where the copper foil was faced outward, and its flexibility was judged by the presence or absence of the fracture of the sheet. The case where the sheet did not fracture was rated as ○ and the case where the sheet fractured was rated as ×.

[Adhesiveness]

An adhesive sheet produced by a predetermined method was cut into a piece measuring 100 mm by 30 mm, and a supporting film was peeled. The resultant was subjected to press curing at a temperature of 180° C. and a pressure of 3 MPa in a state of being sandwiched between an aluminum plate measuring 150 mm by 30 mm by 1 mm and an electrolytic copper foil measuring 150 mm by 30 mm by 35 µm. A test piece for measuring a peel strength at 90° C. was produced by removing, from the resultant single-sided copper-clad, aluminum plate-attached sheet, the copper foil except the central portion having a width of 10 mm. The peel strength of the test piece was measured in conformity with JIS-C6481. The case where the test piece had a peel strength of 0.5 kN/m or more was rated as o which indicates good adhesiveness, and the case where the test piece had a peel strength of less than 0.5 kN/m was rated as x which indicates poor adhesiveness.

[Withstand Voltage]

An adhesive sheet produced by a predetermined method was cut into a piece measuring 50 mm by 50 mm, and a supporting film was peeled. The resultant was subjected to press curing at a temperature of 180° C. and a pressure of 3 MPa in a state of being sandwiched between electrolytic copper foils each measuring 70 mm by 70 mm by 35 µm. A cured sheet unit was obtained by peeling the copper foils on both surfaces from the resultant double-sided copper-clad sheet. A dielectric breakdown voltage test was performed by using the five cured sheet units under the following condition. The case where a pass rate at a dielectric breakdown voltage of 5 kV or more was 80% or more was judged as ○ indicative of a good withstand voltage, and the case where the pass rate was less than 80% was judged as × indicative of a bad withstand voltage.

[Heat Conductivity]

An adhesive sheet produced by a predetermined method was cut into a piece measuring 50 mm by 50 mm, and a supporting film was peeled. The resultant was subjected to press curing at a temperature of 180° C. and a pressure of 3 MPa in a state of being sandwiched between electrolytic copper foils each measuring 70 mm by 70 mm by 35 µm. A cured sheet unit was obtained by peeling the copper foils on both surfaces from the resultant double-sided copper-clad sheet. The cured sheet unit was cut into a piece measuring 10 mm by 10 mm, and then its thermal diffusivity at 25° C. was measured by using a heat conductivity-measuring apparatus LFA447 NanoFlash (manufactured by NETZSCH). The heat conductivity was calculated by the same method as that for the heat conductivity of a molded body described in the foregoing.

[Void Content]

The void content of a cured adhesive sheet was measured by the same method as that for the void content of a molded body.

TABLE 2

| Composition (part(s) by mass) | | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Resin | YD-128 | 17.6 | 16.0 | 14.2 | 22.4 | 31.0 | 16.0 | 14.7 | 14.7 | 14.7 | 17.0 | 17.6 | 16.0 |
| Filler (A) having a higher compressive strength | Aluminum nitride FAN-f50-J | 15.9 | 43.5 | 76.9 | 45.7 | 33.7 | 43.5 | 66.7 | 66.7 | 66.7 | | | 43.4 |
| | Alumina CB-A50S | | | | | | | | | | | | |
| | Glass beads GB301S | | | | | | | | | | | 38.1 | |
| Filler (B) having a lower compressive strength | hBN agglomerated particle UHP-2 | 66.5 | 40.4 | 8.9 | 31.8 | 35.2 | 40.4 | | | | | | |
| | hBN agglomerated particle PTX-60S | | | | | | | 18.6 | | | 35.8 | 44.3 | 35.2 |
| | hBN agglomerated particle PT-40S | | | | | | | | 18.6 | | | | |
| | hBN agglomerated particle 7ECO-20091045-B | | | | | | | | | 18.6 | | | |
| Other filler | Aluminum hydroxide HT-321 | | | | | | | | | | | | 5.4 |
| Evaluation item | Total volume content of fillers (vol %) | 70.0 | 70.0 | 70.0 | 60.0 | 50.0 | 70.0 | 70.0 | 70.0 | 70.0 | 70.0 | 70.0 | 70.0 |
| | Heat conductivity (W/m·K) | 16.4 | 23.6 | 20.1 | 12.8 | 10.2 | 22.4 | 30.5 | 34.1 | 34.2 | 16.5 | 10.9 | 17.8 |
| | Void content (%) | 0.2 | 0.2 | 0.5 | 2.1 | 2.7 | 3.0 | 2.5 | 2.2 | 1.8 | 1.5 | 1.8 | 1.0 |

YD-128 Bisphenol A-type epoxy resin manufactured by NIPPON STEEL & SUMIKIN CHEMICAL CO., LTD.
FAN-f50-J Aluminum nitride having an average particle diameter of 50 μm manufactured by FURUKAWA DENSHI CO., LTD.
CB-A50S Alumina having an average particle diameter of 50 μm manufactured by SHOWA DENKO K.K.
GB301 Glass beads having an average particle diameter of 50 μm manufactured by Potters-Ballotini Co., Ltd.
UHP-2 Classified product of an hBN agglomerated particle manufactured by SHOWA DENKO K.K.
PTX-60S hBN agglomerated particle having an average particle diameter of 60 μm manufactured by Momentive Performance Materials Inc.
PT-405 hBN agglomerated particle having an average particle diameter of 40 μm manufactured by Momentive Performance Materials Inc.
TECO-20091045 hBN agglomerated particle having an average particle diameter of 63 μm manufactured by Momentive Performance Materials Inc.
HT-321 Aluminum hydroxide having an average particle diameter of 8 μm manufactured by SHOWA DENKO K.K.

|  |  |  | Comparative Example 1 | Comparative Example 2 | Comparative Example 3 | Comparative Example 4 | Comparative Example 5 |
|---|---|---|---|---|---|---|---|
| Composition (part(s) by mass) | Resin | YD-128 | 18.5 | 26.1 | 34.6 | 26.1 | 34.6 |
|  | Filler (B) having a lower compressive strength | hBN agglomerated particle UHP-2 | 81.5 | 73.9 | 65.4 | 31.8 |  |
|  |  | hBN agglomerated particle PTX-60S |  |  |  | 73.9 | 65.4 |
| Total volume content of fillers (Vol %) |  |  | 70.0 | 60.0 | 50.0 | 60.0 | 50.0 |
| Evaluation item | Heat conductivity (W/m · K) |  | 15.4 | 10.6 | 8.4 | Molding failure | 9.5 |
|  | Void content (%) |  | 11.3 | 6.7 | 7.6 | Molding failure | 3.0 |

YD-128 Bisphenol A-type epoxy resin manufactured by NIPPON STEEL & SUMIKIN CHEMICAL CO., LTD.
UHP-2 Classified product of an hBN agglomerated particle manufactured by SHOWA DENKO K.K.
PTX-60S hBN agglomerated particle having an average particle diameter of 60 μm manufactured by Moment ve Performance Materials Inc.

TABLE 4

|  |  |  | Component name |  | Example 13 | Example 14 | Example 15 | Example 16 | Example 17 | Example 18 | Example 19 | Example 20 | Example 21 | Example 22 |
|---|---|---|---|---|---|---|---|---|---|---|---|---|---|---|
| Non-volatile matter composition (part(s) by mass) | Filler | Filler (A) having a higher compressive strength | Aluminum nitride | FAN-f50-J | 309 | 309 | 452 | — | — | — | — | — | — | — |
|  |  |  | Alumina | CB-A50S | — | — | — | 346 | 346 | 346 | 346 | 346 | 346 | 346 |
|  |  | Filler (B) having a lower compressive strength | hBN agglomerated particle | TECO-20091045-B | 71 | 71 | 125 | 99 | 99 | 99 | 99 | 99 | 99 | 99 |
|  | Resin component | Thermosetting resin component (C-1) | Epoxy resin 1 | EPOTOHTO YH-434L | 35 | 35 | 35 | 34 | — | — | 10 | 15 | 15 | 15 |
|  |  |  | Epoxy resin 2 | EPICLON HP4700 | — | — | — | — | 35 | — | — | — | — | — |
|  |  |  | Acrylic resin 1 | FAMCRUL FA-731A | — | — | — | — | — | 34 | 25 | 35 | 35 | 35 |
|  |  | Thermosetting resin component (C-2) | Epoxy resin 3 | EPOTOHTO YD-128 | 10 | 10 | 10 | — | — | — | — | — | — | — |
|  |  |  | Epoxy resin 4 | EPOTOHTO YDF-870GS | — | — | — | 9 | 13 | 10 | 10 | 17 | 17 | 17 |
|  |  |  | Epoxy resin 5 | EPICLON N680 | — | — | — | — | — | 23 | 15 | — | — | — |
|  |  |  | Epoxy resin 6 | EPICLON HP7200 | — | — | — | — | — | — | — | — | — | — |
|  |  |  | Acrylic resin 2 | KAYARAD DPCA-60 | — | — | — | — | — | — | — | — | — | — |
|  |  | Thermoplastic resin component (D) | Butyral resin | S-LEC SV-02 | 25 | 25 | 25 | 25 | 25 | 15 | 20 | 10 | — | — |
|  |  |  | Polyester resin | SP182 | — | — | — | — | — | — | — | — | 10 | 10 |
|  |  | Other resin component | Phenol resin | SHONOL BRN-5834Y | 10 | 10 | 10 | — | — | — | — | — | — | — |
|  |  |  |  | SN-395 | 20 | 20 | 20 | 32 | 27 | 18 | 20 | 23 | 23 | 23 |
|  | Curing Catalyst | Imidazole compound | CUREZOL C11Z-CN |  | 0.3 | 0.3 | 0.3 | 0.3 | 0.3 | 0.3 | 0.3 | 0.3 | 0.3 | 0.3 |
|  |  | Organic peroxide | PERCUMYL H-80 |  | — | — | — | — | — | 0.7 | 0.7 | 0.7 | 0.7 | 0.7 |
| Filler/resin component ratio (mass) |  |  |  |  | 79/21 | 79/21 | 85/15 | 82/18 | 82/18 | 82/18 | 82/18 | 82/18 | 82/18 | 82/18 |
| Filler/resin component ratio (volume) |  |  |  |  | 60/40 | 60/40 | 70/30 | 60/40 | 60/40 | 60/40 | 60/40 | 60/40 | 60/40 | 60/40 |
| Evaluation item | Glass transition temperature | (° C.) |  |  | 185 | 185 | 185 | 177 | 175 | 167 | 171 | 175 | 177 | 177 |
|  | Workability |  |  |  | ○ | ○ | ○ | ○ | ○ | ○ | ○ | ○ | ○ | ○ |
|  | Moldability |  |  |  | ○ | ○ | ○ | ○ | ○ | ○ | ○ | ○ | ○ | ○ |

TABLE 4-continued

| Component name | | Example 13 | Example 14 | Example 15 | Example 16 | Example 17 | Example 18 | Example 19 | Example 20 | Example 21 | Example 22 |
|---|---|---|---|---|---|---|---|---|---|---|---|
| Flexibility | | ○ | ○ | ○ | ○ | ○ | ○ | ○ | ○ | ○ | ○ |
| Adhesiveness | | ○ | ○ | ○ | ○ | ○ | ○ | ○ | ○ | ○ | ○ |
| Heat conductivity | | 16.1 | 19.3 | 19.8 | 10.8 | 10.3 | 10.7 | 10.6 | 10.2 | 10.3 | 10.3 |
| Withstand voltage | | ○ | ○ | ○ | ○ | ○ | ○ | ○ | ○ | ○ | ○ |
| Void content | (%) | 2.4 | 2.5 | 4.3 | 2.6 | 3.8 | 2.1 | 2.4 | 2.2 | 1.8 | 1.8 |

TABLE 5

| | | | Component name | | Comp. Example 6 | Comp. Example 7 | Comp. Example 8 | Comp. Example 9 | Comp. Example 10 | Comp. Example 11 | Comp. Example 12 |
|---|---|---|---|---|---|---|---|---|---|---|---|
| Nonvolatile matter composition (part(s) by mass) | Filler | Filler (A) having a higher compressive strength | Aluminum nitride | FAN-f50-J | — | — | — | — | — | — | — |
| | | | Alumina | CB-A50S | 346 | 346 | 346 | 346 | 346 | 346 | 346 |
| | | Filler (B) having a lower compressive strength | hBN agglomerated particle | TECO-20091045-B | 99 | 99 | 99 | 99 | 99 | 99 | 99 |
| | Resin component | Thermosetting resin component (C-1) | Epoxy resin 1 | EPOTOHTO YH-434L | 23 | — | — | 10 | 10 | 35 | 35 |
| | | | Epoxy resin 2 | EPICLON HP4700 | — | — | — | — | — | — | — |
| | | | Acrylic resin 1 | FAMCRUL FA-731A | — | — | — | — | 35 | — | — |
| | | Thermosetting resin component (C-2) | Epoxy resin 3 | EPOTOHTO YD-128 | — | — | — | — | — | — | — |
| | | | Epoxy resin 4 | EPOTOHTO YDF-870GS | 20 | 10 | 12 | 15 | 30 | 20 | — |
| | | | Epoxy resin 5 | EPICLON N680 | — | 40 | — | — | — | — | — |
| | | | Epoxy resin 6 | EPICLON HP7200 | — | — | 35 | — | — | — | — |
| | | | Acrylic resin 2 | KAYARAD DPCA-60 | — | — | — | 25 | — | — | — |
| | | Thermoplastic resin component (D) | Butyral resin | S-LEC SV-02 | 25 | 25 | 25 | 25 | — | 4 | 35 |
| | | | Polyester resin | SP182 | — | — | — | — | — | — | — |
| | | Other resin component | Phenol resin | SHONOL BRN-5834Y SN-395 | 32 | 25 | 28 | 25 | 25 | 41 | 30 |
| | | Curing Catalyst | Imidazole compound | CUREZOL C11Z-CN | 0.3 | 0.3 | 0.3 | 0.3 | 0.3 | 0.3 | 0.3 |
| | | | Organic peroxide | PERCUMYL H-80 | — | — | — | 0.7 | 0.7 | — | — |
| | Filler/resin component ratio (mass) | | | | 82/18 | 82/18 | 82/18 | 82/18 | 82/18 | 82/18 | 82/18 |
| | Filler/resin component ratio (volume) | | | | 60/40 | 60/40 | 60/40 | 60/40 | 60/40 | 60/40 | 60/40 |
| Evaluation item | | Glass transition temperature | (° C.) | | 141 | 171 | 151 | 58 | 185 | 177 | 83 |
| | | Workability | | | ○ | x | ○ | ○ | x | ○ | ○ |
| | | Moldability | | | ○ | x | ○ | ○ | unmeasureable | ○ | x |
| | | Flexibility | | | ○ | ○ | ○ | ○ | unmeasureable | x | ○ |
| | | Adhesiveness | | | ○ | ○ | ○ | ○ | unmeasureable | x | ○ |
| | | Heat conductivity | | | 10.3 | 8.3 | 10.2 | 10.1 | unmeasureable | 10.2 | 7.8 |
| | | Withstand voltage | | | ○ | x | ○ | ○ | unmeasureable | x | x |
| | | Void content | (%) | | 2.4 | 8.7 | 3.6 | 3.1 | unmeasureable | 2.6 | 9.4 |

As can be seen from the results of Tables 2 and 3, the combination of the thermosetting resin, the filler (A) having a higher compressive breaking strength, especially aluminum nitride, and the filler (B) having a lower compressive breaking strength, especially the hBN agglomerated particle has made it possible to obtain a cured product having a high heat conductivity in its thickness direction.

Further, as can be seen from the results of Tables 4 and 5, the combination of the thermosetting resin, the filler (A) having a higher compressive breaking strength, and the filler (B) having a lower compressive breaking strength, especially the hBN agglomerated particle has made it possible to obtain a cured product having a high heat conductivity in its thickness direction, and at the same time, maintaining a state where a void content in a molded body was low even after undergoing a sheet production step. The practical physical properties of the cured product were good as well.

The adhesive sheets of Examples 13 to 22 showed no problems in terms of practical physical properties and had good heat conductivities. The adhesive sheet of Example 14 that had the same composition and had not undergone the step of attaching heat radiation resin layers to each other was improved in heat conductivity as compared with that of Example 13.

In the adhesive sheet of Comparative Example 6, the thermosetting resin (C-1) is blended at less than 25 mass % with respect to all resin components, and hence the sheet has a low glass transition temperature, i.e., poor heat resistance. In Comparative Example 7 in which a polyfunctional epoxy resin having a number-average molecular weight of 1,000 or more was blended instead of the thermosetting resin component (C-1), the glass transition temperature was high because the polyfunctional epoxy resin was blended. However, the handleability, moldability, and withstand voltage characteristic of the adhesive sheet were poor. In Comparative Example 8 in which an epoxy resin having a low functional group density was blended instead of the thermosetting resin (C-1), the glass transition temperature was low and hence the heat resistance was poor. In Comparative Example 9 in which an acrylic resin having a low functional group density was blended instead of the thermosetting resin (C-1), the glass transition temperature was low and hence the heat resistance was poor. In Comparative Example 10 in which the thermoplastic resin (D) was not blended, a sheet could not be stably formed. In Comparative Example 11 in which the blending amount of the thermoplastic resin (D) was small, the flexibility, adhesiveness, and withstand voltage of the sheet were poor. In Comparative Example 12 in which the blending amount of the thermoplastic resin (D) was large, the heat resistance, moldability, and withstand voltage of the sheet were poor.

INDUSTRIAL APPLICABILITY

The combination of the thermosetting resin, the filler (A) having a higher compressive breaking strength, especially aluminum nitride, and the filler (B) having a lower compressive breaking strength, especially the hBN agglomerated particle can provide a curable heat radiation composition, the cured product of which has a high heat conductivity in its thickness direction. The curable heat radiation resin composition of the present invention is extremely useful in the field of, for example, a power semiconductor, a semiconductor element including an optical semiconductor, a semiconductor device, a metal plate for a circuit, a circuit formed of the metal plate, a circuit board, or a hybrid integrated circuit because: the composition shows a high heat conductivity even when it has a relatively low filler content; and the composition is excellent in adhesiveness with a base material.

REFERENCE SIGNS LIST 10, 20, 30, 40 power module
1a, 1b lead frame
2 power semiconductor
3 heat-conductive resin sheet (cured body)
4 heat sink member
5 control semiconductor element
6 metal wire
7 mold resin
11 cured body of heat-conductive resin sheet
12 circuit board
13 power semiconductor
14 heat sink member
15 casing
16 mold resin
17 heat spreader
21a, 21b lead frame
22 metal foil
23 heat-conductive resin sheet (highly heat-conductive insulating sheet)
24 metal heat spreader
25, 26 power semiconductor element
27 solder
28 metal wire
29 mold resin
30 power semiconductor element
31 solder
32 metal heat-conductive spacer
33a metal heat transfer plate
33b protruded terminal portion
34 control electrode terminal portion
35 refrigerant tube
36 bonding wire
37 mold resin
38 highly heat-conductive resin adhesive sheet (cured body)

What is claimed is:

1. A production method for a heat conductive composition comprising: a step of applying a pressure to a mixture including a first filler (A), a second filler (B) having a compressive breaking strength lower than a compressive breaking strength of the first filler (A), and a thermosetting resin (C), wherein the pressure is lower than the compressive breaking strength of the first filler (A) and higher than the compressive breaking strength of the second filler (B), wherein the second filler (B) is a hexagonal boron nitride agglomerated particle, and wherein the second filler (B) is deformed or broken when the step of applying the pressure is conducted, wherein the mass ratio [(A)/(B)] of the first filler (A) to the second filler (B) falls within the range of from 1 to 5, and wherein the first filler (A) is aluminum nitride or alumina.

2. The production method for the heat conductive composition according to claim 1, wherein the step of applying the pressure includes heating the mixture to a temperature in the range of from 70 to 200° C.

3. The production method for the heat conductive composition according to claim 1, wherein the total content of the first filler (A) and the second filler (B) in the mixture is from 50 to 95 mass %.

4. The production method for the heat conductive composition according to claim 1, wherein the compressive breaking strength of the first filler (A) is from 5 to 1500 times the compressive breaking strength of the second filler (B).

5. The production method for the heat conductive composition according to claim 1, wherein the compressive breaking strength of the first filler (A) is from 100 to 1500 MPa, and the compressive breaking strength of the second filler (B) is from 1.0 to 8.16 MPa.

6. The production method for the heat conductive composition according to claim 1, wherein the pressure applied to the mixture is from 10 to 100 MPa in the step of applying the pressure.

7. The production method for the heat conductive composition according to claim 1, wherein the mixture includes another inorganic filler in addition to the first filler (A) and the second filler (B).

8. The production method for the heat conductive composition according to claim 7, wherein the other inorganic filler is selected from aluminum hydroxide, fumed silica, and titanium oxide.

9. The production method for the heat conductive composition according to claim 1, wherein the mixture includes a thermoplastic resin (D).

10. The production method for the heat conductive composition according to claim 9, wherein the content of the thermosetting resin (C) is from 70 to 95 parts by mass with respect to a total content of 100 parts by mass of the thermosetting resin (C) and the thermoplastic resin (D) in the mixture.

11. The production method for the heat conductive composition according to claim 1, wherein the thermosetting resin (C) contains a first thermosetting resin (C-1) having three or more reactive groups of at least one kind selected from an epoxy group and a (meth)acryloyl group in a molecule thereof, having a functional group equivalent of less than 200 g/eq, and having a number-average molecular weight of less than 1000.

12. The production method for the heat conductive composition according to claim 9, wherein the thermoplastic resin (D) contains at least one kind selected from a polyvinyl butyral resin and a polyester resin.

13. The production method for the heat conductive composition according to claim 1, wherein the mixture includes a solvent.

14. The production method for the heat conductive composition according to claim 1, wherein the first filler (A) has an average particle diameter of from 20 to 100 μm and the second filler (B) has an average particle diameter of from 30 to 120 μm.

\* \* \* \* \*